United States Patent [19]
Yap

[11] Patent Number: 5,705,937
[45] Date of Patent: Jan. 6, 1998

[54] APPARATUS FOR PROGRAMMABLE DYNAMIC TERMINATION

[75] Inventor: Kok-Kean Yap, Milpitas, Calif.

[73] Assignee: Cypress Semiconductor Corporation, San Jose, Calif.

[21] Appl. No.: 605,924

[22] Filed: Feb. 23, 1996

[51] Int. Cl.$^6$ .................................................. H03H 11/28
[52] U.S. Cl. ................................................. 326/30; 326/49
[58] Field of Search ............................... 326/30, 86, 38, 326/49, 50

[56] References Cited

U.S. PATENT DOCUMENTS

| | | | |
|---|---|---|---|
| 4,748,426 | 5/1988 | Stewart | 326/20 |
| 5,164,663 | 11/1992 | Alcorn | 327/309 |
| 5,194,765 | 3/1993 | Dunlop | 326/87 |
| 5,220,216 | 6/1993 | Woo | 326/50 |
| 5,341,039 | 8/1994 | Fukumoto | 326/30 |
| 5,422,580 | 6/1995 | Mandel et al. | |
| 5,502,400 | 3/1996 | Livolsi | 326/30 |

FOREIGN PATENT DOCUMENTS 2-170570  7/1990  Japan ......................... 326/30

OTHER PUBLICATIONS

"Active Terminators for CMOS Drivers", IBM Technical Disclosure, vol. 32, No. 4A, copyright 1989 by EBM Corp., pp. 393–395.

"Programmable Impednace Off–Chip Driver", disclosed anonymously, published by Kenneth Mason Publications, Ltd, England, Document No. 31315.

*Primary Examiner*—Edward P. Westin
*Assistant Examiner*—Benjamin D. Driscoll
*Attorney, Agent, or Firm*—Bliss McGlynn, P.C.

[57] ABSTRACT

The present invention provides a device for terminating a data bus. The present invention provides the proper termination without the use of external discrete components. The device can be programmed, at the chip level, to produce particular termination resistances that are commonly used. The present invention termination device uses a minimum of power dissipation which may be useful in applications that require minimum power consumption.

18 Claims, 2 Drawing Sheets

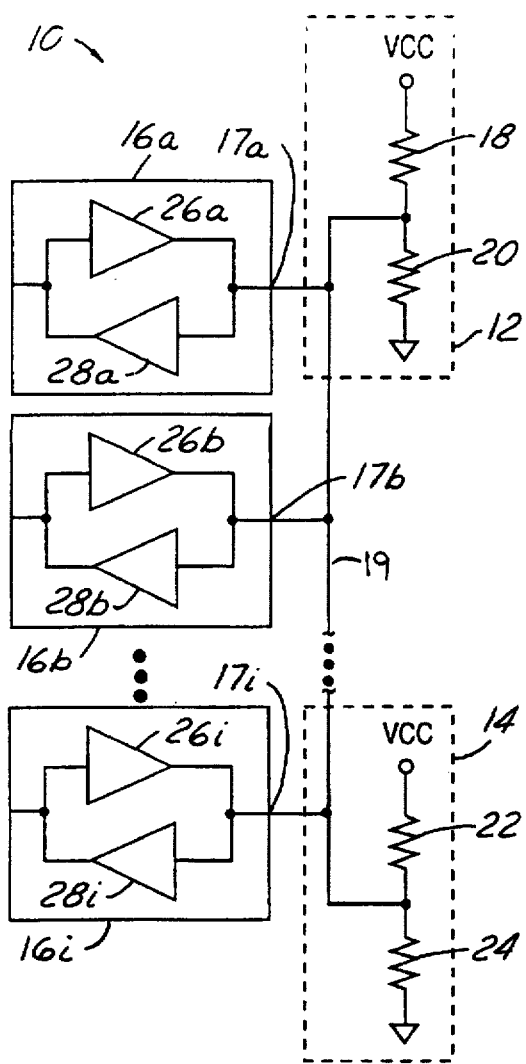
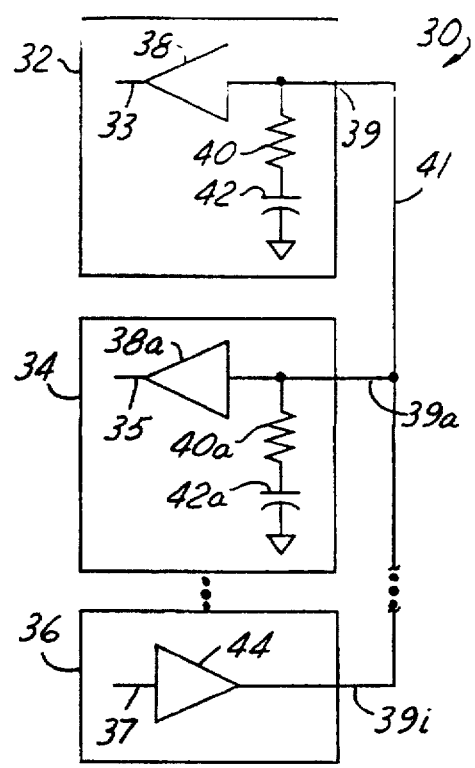
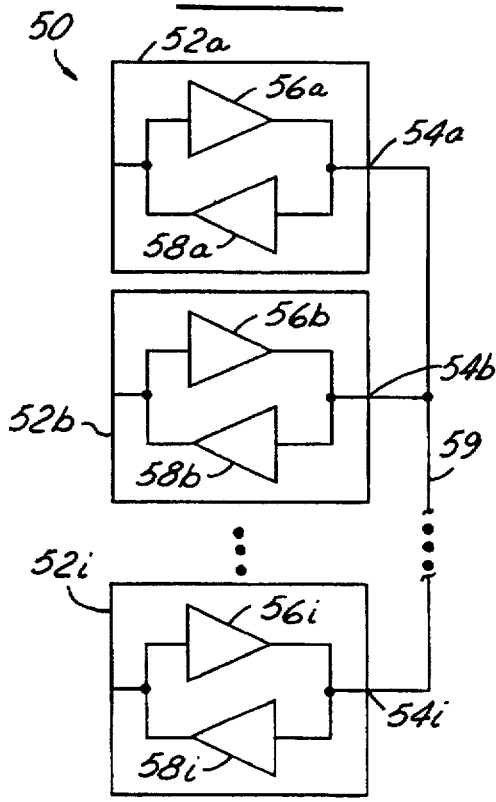
(PRIOR ART)
FIG. 1
(PRIOR ART)
FIG. 2
FIG. 3

APPARATUS FOR PROGRAMMABLE DYNAMIC TERMINATION

FIELD OF THE INVENTION

The present invention relates to termination of devices generally and, more particularly, to dynamically terminating a signal on a multi-drop inter-connection with minimum power dissipation.

BACKGROUND OF THE INVENTION

It is known to use a termination device at the end of a data cable to reduce transmission errors and corruption of data transmitted on the data cable. Termination devices, or terminators, can reduce the propagation of standing waves inside the data cable. Terminators are used, and most often required, in a small computer systems interface (SCSI) bus. Improperly terminated data cables in a SCSI bus can cause problems that appear to be related to the device being connected. Additionally, these types of errors with an improperly terminated device can also be misinterpreted as problems with the software.

Referring to FIG. 1, a termination device 10 according to a typical prior art configuration is shown. The termination device 10 is a common multi-drop termination method using parallel termination implemented with discrete components. The termination device 10 generally comprises a termination element 12, a termination element 14 and a number of integrated components 16a-16i. Each of the integrated components 16a-16i has an output 17a-17i connected to a data bit line 19 that is to be terminated. Therefore, the number of termination elements 12 and 14 is equal to two times the number of data bit lines in the data cable. The number of integrated components 16a-16i can be any number required for the design criteria of a particular application.

The termination element 12 comprises a voltage input Vcc, a ground GND, a first resistor 18 and a second resistor 20. The values of the first resistor 18 and the second resistor 20 are selected in order to provide a voltage dividing effect of the voltage input Vcc. For example, the first transistor 18 may be selected as 220 Ohms and the second resistor 20 may be selected as 300 Ohms. Similarly, the termination element 14 comprises a voltage input Vcc, a ground GND, a first resistor 22 and a second resistor 24. The values of the first resistor 22 and the second resistor 24 are selected in order to provide a voltage dividing effect of the voltage input Vcc. The first transistor 22 may be selected as 220 Ohms and the second resistor 24 may be selected as 300 Ohms. Each of the integrated components 16a-16i comprises an output buffer 26a-26i and an input buffer 28a-28i. The common power dissipation by the parallel terminators at both ends is 96 mW per signal, where Zo=63 Ohms. The resistance Rvcc=220 Ohms and the resistance Rgnd=300 Ohms. It should be appreciated that the terminators on a typical 32-bit 5 volt bus may consume about 3W of power.

Another common termination method is shown in FIG. 2 as a termination device 30. The termination device 30 generally comprises a number of integrated components 32, 34 and 36. The integrated components 32 and 34 have an internal output 33 and 35. The integrated component 36 has an internal input 37. Each of the integrated components 32, 34 and 36 has an to output 39a-39i connected to a data bit line 41 to be terminated. The integrated component 32 comprises an input buffer 38, a resistor 40 and a capacitor 42. Similarly, the integrated component 34 comprises an input buffer 38a, a resistor 40a and a capacitor 42a. The integrated component 36 comprises an output buffer 44. While the termination device 30 consumes no DC power, it requires a single termination at integrated component 32 and 34 that is configured in a parallel configuration.

It should be noted that the prior art methods required individual configuration for a particular termination device to be implemented separately for each type of bus to be terminated. For example, one termination method may be required to be implemented for a SCSI bus, while a second termination method may have to be configured for an Industry Standard Architecture (ISA) bus. With various standard computer buses currently available on the market, the manufacturing capabilities necessary to produce individual termination devices may be undesirable. Typically, discrete components are required to program the level of termination required. These discrete components require connections on the circuit board which takes up additional board space. Reducing board space on computer components is a major design concern. The first mentioned prior art termination device 10 typically used power in excess of three watts. This additional power consumption can be costly in minimum power consumption applications such as personal digital assistances (PDAs) or notebook computers.

SUMMARY OF THE INVENTION

The present invention provides a device for terminating a data bus. The present invention provides the proper termination without the use of external discrete components. The termination device can be programmed, at the chip level, to produce particular termination impedances that are commonly used. The present invention termination device uses a minimum of power dissipation which may be useful in applications that require minimum power consumption.

Objects, features and advantages of the present invention are to provide a termination device that has no external discrete components, can be programmed to any desired value and uses a minimum of power.

BRIEF DESCRIPTION OF THE DRAWINGS

These and other objects, features and advantages of the present invention will be apparent from the following detailed description and the appended claims in which:

FIG. 1 is a diagram of a prior art termination device;

FIG. 2 is a diagram of an alternate prior art device;

FIG. 3 is a block diagram of the presently preferred embodiment of the invention.

DETAILED DESCRIPTION OF THE PREFERRED EMBODIMENT

Figure 4:
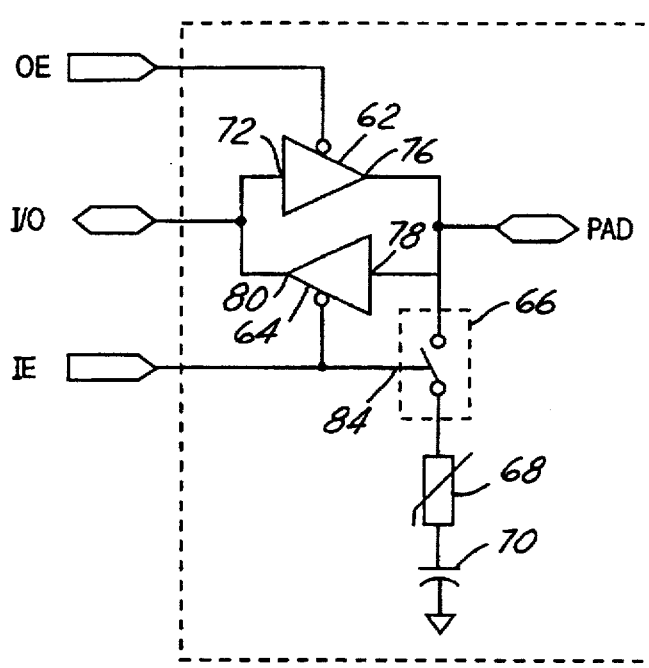
FIG. 4 is a more detailed block diagram of the presently preferred embodiment of the invention.

Referring to FIG. 3, a conceptual block diagram of a termination device 50 in accordance with the presently preferred embodiment of the invention is shown. The termination device 50 generally comprises a number of integrated components 52a, 52b and 52i. The number of integrated components can be any number necessary for the design criteria of a particular application. Each of the integrated components 52a -52i have an internal input and output 54a, 54b and 54i. The termination element 52a comprises an output buffer 56a and an input buffer 58a. The integrated component 52b comprises an output buffer 56b and an input buffer 58b. The integrated component 52i comprises an output buffer 56i and an input buffer 58i. Each of the integrated components 52a –52i provide internal input and outputs 54a–54i. The termination impedance present at the input buffers 58a–58i can be programmed to a number of predetermined values. This programming will be described in more detail in connection with FIG. 5. Each of the integrated components 52a –52i has an output 54a–54i that is coupled to a data bit line 59.

Referring to FIG. 4, a block diagram of a particular integrated component 54 is shown. The integrated component 54 generally comprises an output enable OE, an internal input/output I/O, an input enable IE, an output buffer 62, an input buffer 64, an output PAD, a switch 66, a variable resistor 68 and a capacitor 70. The output PAD produces bonding pads that provide a path to an external device. The output buffer 62 receives an input 72 from the internal input/output I/O and an inverted input 74 from the output enable OE. The output buffer 62 presents an output 76 that is received by the output PAD, the switch 66 and an input 78 to the input buffer 64. The input buffer 64 presents an output 80 to the internal input/output I/O. The buffer 64 also has an inverted input 82 that is received from the input enable IE. The input enable IE is also presented to an input 84 of the switch 66. The input enable IE is used to toggle the input impedance of the integrated component 54. All of the internal components (i.e., the switch 66, the variable resistor 68 and the capacitor 70) are included in each of the blocks 52a, 52b and 52i.

Figure 5:
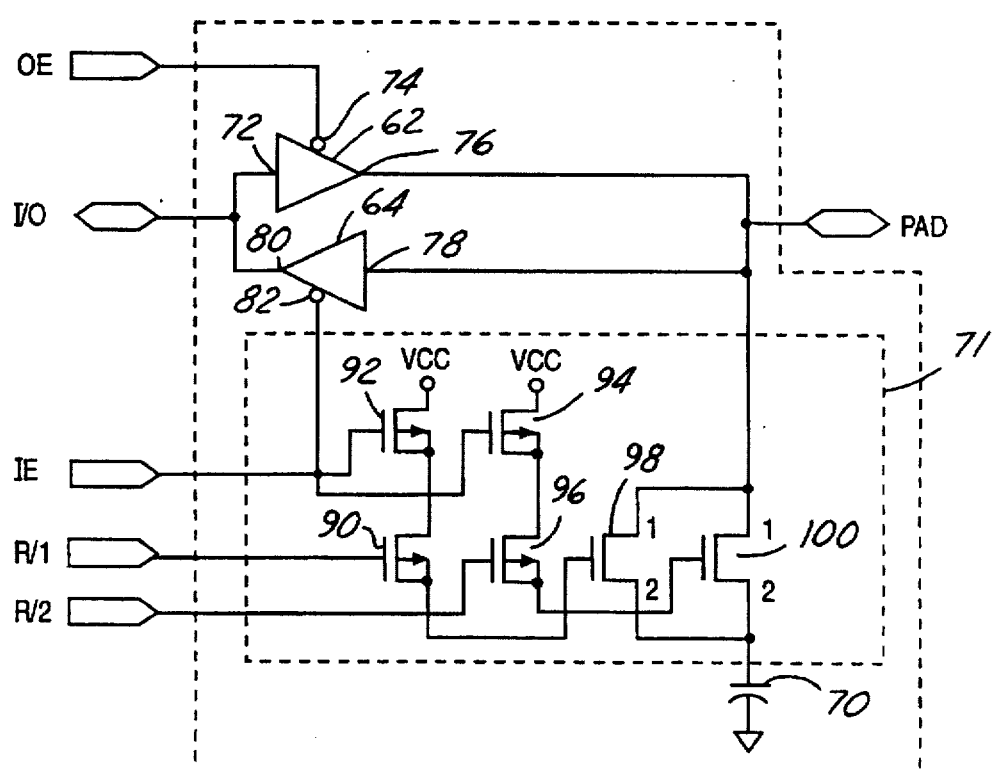
FIG. 5 is a circuit diagram of the presently preferred embodiment of the invention.

Referring to FIG. 5, a circuit diagram illustrating a more detailed description of the variable resistor 68 is shown. FIG. 5 includes a more detailed diagram of the variable resistor 68 including the switch 66. A variable resistor 68 and the switch 66 combined to form a switchable variable resistor 71. The switchable variable resistor 71 further comprises a first transistor 90, a second transistor 92, a third transistor 94, a fourth transistor 96, a pass gate 98 and a pass gate 100. The switchable variable resistor 71 further comprises a first control input RI1 and a second control input RI2. The first and second control inputs RI1 and RI2, in combination with the input enable IE, configure the switchable variable resistor 71 to provide the proper resistance of the particular input buffer 58a–58i. The transistors 90–96 can be either p-channel CMOS transistors or any other appropriate transistor. However, CMOS transistors will provide a low power consumption device. Similarly, the pass gates 98 and 100 can be implemented using CMOS technology or any other appropriate technology.

The transistor 92 receives a signal from the input enable IE at a gate and has a source connected to an input voltage Vcc. The drain of the transistor 92 is coupled to the source of the transistor 90. The gate of the transistor 90 is coupled to the first control input RI1. The drain of the transistor 90 is connected to the gate of the pass gate 98. The source of the transistor 94 is connected to the voltage input Vcc and the drain of the transistor 94 is coupled to the source of the transistor 96. The gate of the transistor 96 is coupled to the second control input RI2. The drain of the transistor 96 is coupled to the gate of the pass gate 100. Each of the pass gates 98 and 100 are illustrated as having a terminal 1 and a terminal 2. The terminal 2 of the pass gate 98 is coupled to the terminal 2 of the pass gate 100 as well as the capacitor 70. The terminal 1 of both the pass gate 98 and the pass gate 100 are coupled together.

The resistance is created by the transistors 90–96 and the pass gates 98 and 100 are determined by the first and second control inputs RI1 and RI2 in combination with the input enable IE. This resistance is defined by the following TABLE 1:

TABLE 1

| IE | R1 | R2 | RESISTANCE |
|----|----|----|------------|
| 0  | 0  | 1  | R1         |
| 0  | 1  | 0  | R2         |
| 0  | 0  | 0  | R1/R2      |
| 1  | X  | X  | OPEN       |

If the input enable IE, is 0, the first control input RI1 is 1 and the second control input RI2 is 0, then the resistance seen at the capacitor 70 is equal to resistance R2, which is the internal resistance of the pass gate 100. If the input enable IE is 0, the first control input RI1 is 0 and the second control input RI2 is 1, then the output seen at the capacitor 70 is equal to the resistance R1, which is the internal resistance of the pass gate 98. If the input enable IE is 0, the first control input RI1 is 0 and the second control input RI2 is 0, then the resistance seen at the capacitor 70 is equal to the resistance R1 in parallel with the R2. If the input enable IE is equal to 1, then the resistance seen at the capacitor 70 is always an open resistance.

It should be noted that the first control input RI1 and the second control input RI2 represent two independent values that work in combination with the transistors 90–96 and the pass gates 98 and 100 to select an appropriate resistance seen at the load outputs. Specifically, the transistor 90 and the transistor 92 work in combination with the pass gate 98 to provide the resistance R1. Similarly, the transistor 94 and the transistor 96 work in to combination with the pass gate 100 to provide the resistance R2. As illustrated in TABLE 1, three possible resistances can be created with the input enable IE, the first control input RI1 and the second control input RI2. It should be noted that if more resistances are required to meet the design criteria of a particular application, an additional control input RIX could be added. This would require an additional set of transistors coupled between the input Vcc and ground as well as an additional pass gate. These additional components would create an additional resistance value R3 that could be selected similar to the resistance selections illustrated in TABLE 1. It should be noted that any number of control inputs could be implemented to create the desired number of resistances seen by each individual termination element 54. This may be desirable in an application where a single device could be manufactured to provide proper termination resistances for a number of bus structures available in the marketplace. It is generally more economically advantageous for a manufacturer to produce a single part that can be configured for a number of applications than to produce a number of different parts for each particular application.

It is to be understood that modifications to the invention might occur to one with skill in the field of the invention within the scope of the appended claims.

I claim:
1. A device for terminating a data bus comprising:
one or more termination elements each having (i) a load output, (ii) a bus input and (iii) a plurality of control inputs, each of said elements presents one of a plurality of resistances at each of said load outputs in response to said plurality of control inputs; and
an input enable that is at either (i) a first digital state that enables said plurality of resistances or (ii) a second digital State that prevents any of said plurality of resistances from being presented at said load outputs.

2. The device according to claim 1 wherein said control inputs comprise a first control input and a second control input, wherein said first and second control inputs are used to determine which one of said plurality of resistances is presented at each of said load outputs.

3. The device according to claim 1 wherein:
one of said resistances is configured to operate as a terminator of an Industry Standard Architecture (ISA) bus; and
another one of said resistances is configured as a terminator of a Small Computer Systems Interface (SCSI) bus.

4. The device according to claim 1 further comprising an input/output terminal for providing an interface between said terminating device and an internal circuit.

5. The device according to claim 1 further comprising a bonding pad for providing an interface between said terminating device and an external device.

6. The device according to claim 5 further comprising:
a plurality of transistors wherein at least two of said plurality of transistors provide a first resistance path and at least two of said plurality of transistors provide a second resistance path;
a plurality of pass gates wherein at least one of said plurality of pass gates has a gate coupled to one of said plurality of control inputs to enable said first resistance path to produce one of said plurality of resistances; and
another one of said plurality of pass gates has a gate coupled to another one of said plurality of control signals to enable said second resistance path to produce another one of said plurality of resistances.

7. The device according to claim 6 wherein each said plurality of pass gates is at a first state that enables said first or second resistance path or is at a second state that disables said first or second resistance path.

8. The device according to claim 7 wherein each of said plurality of pass gates switches between said first and second states in response to one of said plurality of control inputs.

9. The device according to claim 6 wherein each of said plurality of pass gates is at said first state when a first combination of said control inputs is present and is at a second state when a second combination of said control inputs is present.

10. The device according to claim 6 wherein said plurality of transistors are n-channel MOS transistors.

11. The device according to claim 6 wherein said plurality of pass gates are p-channel MOS pass gates.

12. The device according to claim 6 wherein said plurality of transistors are p-channel MOS transistors.

13. A device for terminating a data bus comprising:
one or more termination elements each having (i) a load output, (ii) a bus input and (iii) a plurality of control inputs, each of said elements presents one of a plurality of resistances at each of said load outputs in response to said plurality of control inputs;
a plurality of transistors wherein at least two of said plurality of transistors provide a first resistance path and at least two of said plurality of transistors provide a second resistance path;
a plurality of pass gates wherein at least one of said plurality of pass gates has a gate coupled to one of said plurality of control inputs to enable said first resistance path to produce one of said plurality of resistances; and
another one of said plurality of pass gates has a gate coupled to another one of said plurality of control signals to enable said second resistance path to produce another one of said plurality of resistances.

14. The device according to claim 13 wherein each of said plurality of pass gates is at a first state that enables said first or second resistance path or is at a second state that disables said first or second resistance path.

15. The device according to claim 14 wherein each of said plurality of pass gates switches between said first and second states in response to one of said plurality of control inputs.

16. The device according to claim 13 wherein each of said plurality of pass gates is at said first state when a first combination of said control inputs is present and is at a second state when a second combination of said control inputs is present.

17. The device according to claim, 13 wherein said plurality of transistors are n-channel MOS transistors.

18. The device according to claim 13 wherein said plurality of pass gates are p-channel MOS pass gates.

* * * * *